(12) United States Patent
Han et al.

(10) Patent No.: US 11,582,615 B2
(45) Date of Patent: Feb. 14, 2023

(54) METHOD AND DEVICE FOR ALLOWING SIMULATOR TO ANALYZE RADIO WAVE ENVIRONMENT IN WIRELESS COMMUNICATION SYSTEM

(71) Applicants: SAMSUNG ELECTRONICS CO., LTD., Suwon-si (KR); INDUSTRY-ACADEMIC COOPERATION FOUNDATION, YONSEI UNIVERSITY, Seoul (KR)

(72) Inventors: Seungku Han, Suwon-si (KR); Won Woo Ro, Seoul (KR); Byungchul Kim, Suwon-si (KR); Myungkuk Yoon, Seoul (KR); Hyunjin Chung, Seoul (KR); Youngju Lee, Suwon-si (KR)

(73) Assignees: SAMSUNG ELECTRONICS CO., LTD., Suwon-si (KR); INDUSTRY-ACADEMIC COOPERATION FOUNDATION, YONSEI UNIVERSITY, Seoul (KR)

( * ) Notice: Subject to any disclaimer, the term of this patent is extended or adjusted under 35 U.S.C. 154(b) by 368 days.

(21) Appl. No.: 16/959,277

(22) PCT Filed: Dec. 28, 2018

(86) PCT No.: PCT/KR2018/016932
§ 371 (c)(1),
(2) Date: Jun. 30, 2020

(87) PCT Pub. No.: WO2019/135574
PCT Pub. Date: Jul. 11, 2019

(65) Prior Publication Data
US 2020/0336919 A1    Oct. 22, 2020

(30) Foreign Application Priority Data
Jan. 4, 2018 (KR) .................. 10-2018-0001211

(51) Int. Cl.
*H04W 16/18* (2009.01)
*H04B 17/318* (2015.01)
(Continued)

(52) U.S. Cl.
CPC ............ *H04W 16/18* (2013.01); *G06F 30/20* (2020.01); *G06T 1/20* (2013.01); *G06T 7/62* (2017.01);
(Continued)

(58) Field of Classification Search
CPC ....... H04W 16/18; H04W 16/22; G06F 30/20; G06T 1/20; G06T 7/62; G06T 15/06;
(Continued)

(56) References Cited

U.S. PATENT DOCUMENTS 8,526,711 B2 * 9/2013 Yoon ....................... G06T 15/06
382/154
2011/0134132 A1 6/2011 Wolf
(Continued)

FOREIGN PATENT DOCUMENTS

KR    10-2015-0125437    11/2015
KR    10-2017-0090104    8/2017

OTHER PUBLICATIONS

International Search Report for PCT/KR2018/016932, dated Apr. 4, 2019, 4 pages.
(Continued)

*Primary Examiner* — Jitesh Patel
(74) *Attorney, Agent, or Firm* — Nixon & Vanderhye, P.C.

(57) ABSTRACT

Disclosed is a 5G or pre-5G communication system for supporting a data transmission rate higher than that of a 4G communication system such as LTE. The present invention relates to a method by which a simulator analyzes a radio wave environment in a wireless communication system, and
(Continued)

the method of the present invention comprises the steps of: allowing a simulator to receive geographic information and position information by which a transmitter and a receiver can be positioned in the geographic information; generating, by the transmitter of the simulator arranged at a random position in accordance with the position information, radio waves for at least one direction of a sphere having a fixed radius; grouping into at least one group on the basis of a traveling route of the generated radio waves; setting each group as an operation unit (Warp/Wavefront) for a graphics processing unit (GPU); and analyzing a radio wave environment by using the GPU in which the operation unit is set.

11 Claims, 14 Drawing Sheets

(51) Int. Cl.
    *G06T 7/62*         (2017.01)
    *G06F 30/20*      (2020.01)
    *G06T 1/20*         (2006.01)
    *G06T 15/06*      (2011.01)
(52) U.S. Cl.
    CPC ........... *G06T 15/06* (2013.01); *H04B 17/318* (2015.01); *G06T 2215/16* (2013.01)

(58) Field of Classification Search
    CPC .............. G06T 2215/16; H04B 17/318; H04B 17/3912; H04B 17/0087; H04B 17/30
    See application file for complete search history.

(56) References Cited

U.S. PATENT DOCUMENTS

| | | |
|---|---|---|
| 2011/0287801 A1* | 11/2011 | Levin .................. H04B 17/391 455/67.11 |
| 2013/0226535 A1 | 8/2013 | Tuan |
| 2014/0340403 A1 | 11/2014 | Droske et al. |
| 2015/0319626 A1 | 11/2015 | Yi et al. |
| 2016/0110910 A1 | 4/2016 | Obert et al. |
| 2016/0285572 A1* | 9/2016 | Manghal ............ H04B 17/0087 |
| 2017/0061674 A1 | 3/2017 | Lee et al. |
| 2017/0236325 A1* | 8/2017 | Lecocq .................. G06T 15/55 345/426 |
| 2017/0293994 A1 | 10/2017 | Li et al. |
| 2019/0156550 A1* | 5/2019 | Stanard .................. G06T 15/50 |

OTHER PUBLICATIONS

Written Opinion of the ISA for PCT/KR2018/016932, dated Apr. 4, 2019, 6 pages.

* cited by examiner

METHOD AND DEVICE FOR ALLOWING SIMULATOR TO ANALYZE RADIO WAVE ENVIRONMENT IN WIRELESS COMMUNICATION SYSTEM

This application is the U.S. national phase of International Application No. PCT/KR2018/016932 filed 28 Dec. 2018, which designated the U.S. and claims priority to KR Patent Application No. 10-2018-0001211 filed 4 Jan. 2018, the entire contents of each of which are hereby incorporated by reference.

BACKGROUND

Field

The disclosure relates to a wireless communication system, and more particularly, to a method and apparatus for a simulator to analyze a radio wave environment in a wireless communication system.

Description of Related Art

Mobile communication systems have been generally developed to provide voice services while guaranteeing user mobility. Such mobile communication systems have gradually expanded their coverage from voice services through data services up to high-speed data services. However, as current mobile communication systems providing services suffer resource shortages and users demand even higher-speed services, development of more advanced mobile communication systems is needed.

To meet this demand, the 3rd generation partnership project (3GPP) has been working to standardize specifications for the long term evolution (LTE) system as a next generation mobile communication system. LTE is a technology for implementing high-speed packet-based communication with a transmission speed of up to 100 Mbps with the goal of commercialization in about 2010. To this end, various approaches have been considered, such as reducing the number of nodes on a communication path through simplification of the network architecture and bringing wireless protocols as close as possible to wireless channels.

In addition, to meet the ever increasing demand for wireless data traffic since the commercial deployment of 4G communication systems, efforts have been made to develop improved 5G or pre-5G communication systems. As such, 5G or pre-5G communication systems are also called "beyond 4G network" or "post LTE system".

To achieve high data rates, 5G communication systems are being considered for implementation in the extremely high frequency (mmWave) band (e.g., 60 GHz band). To decrease path loss of radio waves and increase the transmission distance in the mmWave band, various technologies including beamforming, massive multiple-input multiple-output (massive MIMO), full dimensional MIMO (FD-MIMO), array antennas, analog beamforming, and large scale antennas are considered for 5G communication systems.

To improve system networks in 5G communication systems, technology development is under way regarding evolved small cells, advanced small cells, cloud radio access networks (cloud RANs), ultra-dense networks, device-to-device (D2D) communication, wireless backhaul, moving networks, cooperative communication, coordinated multi-points (CoMP) communication, reception interference cancellation, and the like.

Additionally, advanced coding and modulation (ACM) schemes such as hybrid FSK and QAM modulation (FQAM) and sliding window superposition coding (SWSC), and advanced access technologies such as filter bank multi carrier (FBMC), non-orthogonal multiple access (NOMA), and sparse code multiple access (SCMA) are also under development for 5G communication systems.

Meanwhile, ray tracing as a technique for calculating the path of a wave or particle is commonly used in computer graphics. As can be seen in FIG. 1, in computer graphics, ray tracing creates an image by tracking the path of light from the camera (eye) to each pixel. Each pixel is determined by the object the path of light meets. FIG. 1 illustrates a ray tracing technique used in computer graphics.

Ray tracing is used for effectively simulating a 5G wireless network system. As a method of calculating the path of a radio wave that is emitted by the transmitter and arrives at each receiver, the path of each radio wave is tracked, and the simulation is mainly performed for urban environments.

However, in a 5G wireless communication network simulation using ray tracing, as the generation interval between rays is shorter, the number of rays increases, in which case there is a problem that the amount of computation for the simulation increases exponentially. Similarly, as the number of buildings and receivers increases in the urban environment to be simulated, the amount of computation increases exponentially. This can be a serious problem for simulation performance, and discussions are needed to solve this problem.

SUMMARY

The disclosure has been made to solve the above problem and is to provide a method and apparatus that enable a simulator to analyze a radio wave environment with improved performance in a 5G wireless communication network simulation by using a graphics processing unit (GPU).

To solve the above problem, a method for a simulator to analyze a radio wave environment in a wireless communication system according to the disclosure may include: receiving topographic information and position information indicating possible positions of a transmitter and a receiver in the topographic information; generating rays for at least one direction of a sphere having a constant radius from the transmitter placed at a position according to the position information; grouping the generated rays into at least one group based on traveling paths of the rays; configuring the group as a computational unit (warp or wavefront) for a graphics processing unit (GPU) of the simulator; and analyzing the radio wave environment by using the GPU on which the computational unit is configured.

In addition, a method for a simulator to analyze a radio wave environment in a wireless communication system according to the disclosure may include: receiving topographic information and position information indicating possible positions of a transmitter and a receiver in the topographic information; generating rays for at least one direction of a sphere having a constant radius from the transmitter placed at a position according to the position information; assigning the generated rays to plural GPUs of the simulator based on amounts of workload on the GPUs; and analyzing the radio wave environment through operations on the GPUs.

Preferably, assigning the generated rays to plural GPUs of the above method for the simulator to analyze a radio wave environment may assign the rays so that the tasks of the GPUs are completed at the same time.

Preferably, assigning the generated rays to plural GPUs of the above method for the simulator to analyze a radio wave environment may assign the rays so that the individual GPUs process their tasks without transitioning to the idle state.

In addition, a simulator for analyzing a radio wave environment in a wireless communication system according to the disclosure may include: a storage to store topographic information, position information of a transmitter and a receiver in the topographic information, and path tracking results of rays; and a controller configured to generate rays in at least one direction from the transmitter placed at a position according to the position information, group the generated rays into at least one group based on traveling paths of the rays, configure the group as a computational unit for a GPU, and analyze the radio wave environment by using the GPU based on the computational unit.

In addition, a simulator for analyzing a radio wave environment in a wireless communication system according to the disclosure may include: a storage to store topographic information, position information of a transmitter and a receiver in the topographic information, and path tracking results of rays; and a controller configured to generate rays in at least one direction from the transmitter placed at a position according to the position information, assign the generated rays respectively to plural GPUs based on amounts of workload on the GPUs, and analyze the radio wave environment through operations on the GPUs.

Preferably, the controller of the simulator may include a GPU allocator that is configured to assign the rays so that the tasks of the GPUs are completed at the same time.

Preferably, the controller of the simulator may include a GPU allocator that is configured to assign the rays so that the individual GPUs process their tasks without transitioning to the idle state.

According to the disclosure, as the rays are independent and parallel to each other, the simulator can analyze a radio wave environment by accelerating a 5G wireless network simulation using the graphics processing unit (GPU).

DETAILED DESCRIPTION

MODE FOR THE INVENTION

Figure 1:
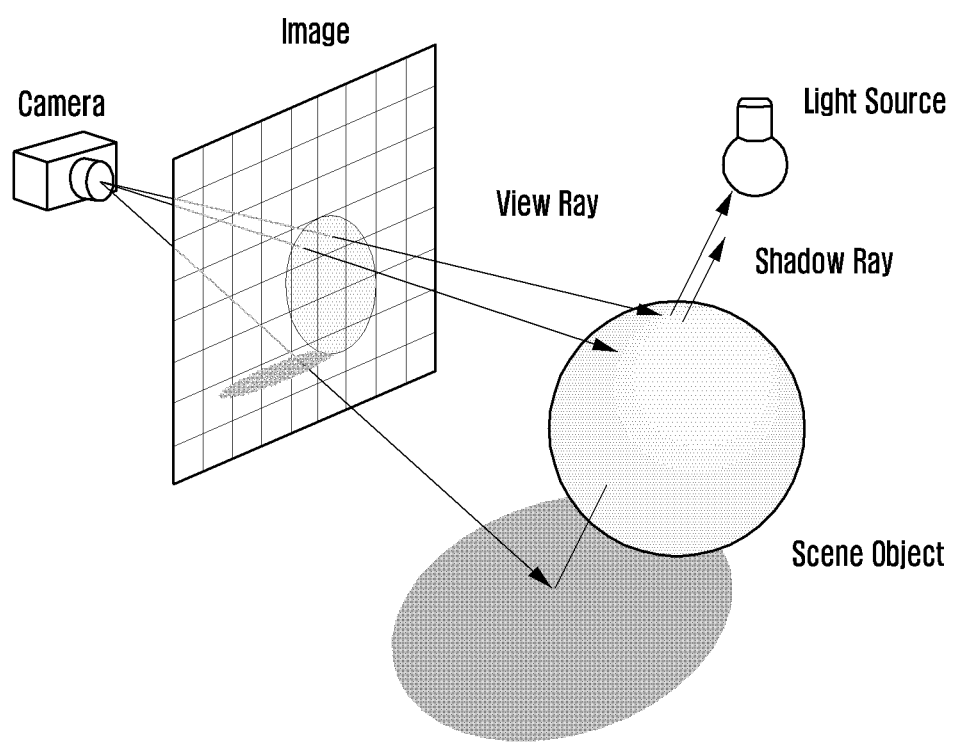
FIG. 1 is a diagram illustrating a ray tracing technique used in computer graphics.

In the following description of embodiments of the disclosure, descriptions of technical details well known in the art and not directly related to the disclosure may be omitted. This is to more clearly convey the gist of the disclosure without obscurities by omitting unnecessary descriptions.

Likewise, in the drawings, some elements are exaggerated, omitted, or only outlined in brief. Also, the size of each element does not necessarily reflect the actual size. The same or similar reference symbols are used throughout the drawings to refer to the same or like parts.

Advantages and features of the disclosure and methods for achieving them will be apparent from the following detailed description of embodiments taken in conjunction with the accompanying drawings. However, the disclosure is not limited to the embodiments disclosed below but may be implemented in various different ways, the embodiments are provided only to complete the disclosure and to fully inform the scope of the disclosure to those skilled in the art to which the disclosure pertains, and the disclosure is defined only by the scope of the claims. The same reference symbols are used throughout the description to refer to the same parts.

Meanwhile, it will be appreciated that blocks of a flowchart and a combination of flowcharts may be executed by computer program instructions. These computer program instructions may be loaded on a processor of a general purpose computer, special purpose computer, or programmable data processing equipment, and the instructions executed by the processor of a computer or programmable data processing equipment create a means for carrying out functions described in blocks of the flowchart. To implement the functionality in a certain way, the computer program instructions may also be stored in a computer usable or readable memory that is applicable in a specialized computer or a programmable data processing equipment, and it is possible for the computer program instructions stored in a computer usable or readable memory to produce articles of manufacture that contain a means for carrying out functions described in blocks of the flowchart. As the computer program instructions may be loaded on a computer or a programmable data processing equipment, when the computer program instructions are executed as processes having a series of operations on a computer or a programmable data processing equipment, they may provide steps for executing functions described in blocks of the flowchart.

Each block of a flowchart may correspond to a module, a segment or a code containing one or more executable instructions for executing one or more logical functions, or to a part thereof. It should also be noted that functions described by blocks may be executed in an order different from the listed order in some alternative cases. For example, two blocks listed in sequence may be executed substantially at the same time or executed in reverse order according to the corresponding functionality.

Here, the word "unit", "module", or the like used in the embodiments may refer to a software component or a hardware component such as an FPGA or ASIC capable of carrying out a function or an operation. However, "unit" or the like is not limited to hardware or software. A unit or the like may be configured so as to reside in an addressable storage medium or to drive one or more processors. For example, units or the like may refer to components such as a software component, object-oriented software component, class component or task component, processes, functions, attributes, procedures, subroutines, program code segments, drivers, firmware, microcode, circuits, data, databases, data structures, tables, arrays, or variables. A function provided by a component and unit may be a combination of smaller components and units, and it may be combined with others to compose larger components and units. Components and units may be implemented to drive one or more processors in a device or a secure multimedia card.

In the disclosure, the radio wave environment analysis may mean that, when a transmitter at a specific position emits radio waves, the simulator obtains information on radio waves received by a specific receiver. The simulator can analyze the radio wave environment based on a simulation of a 5G wireless communication network.

A 5G wireless communication simulation may refer to a procedure for identifying the process in which radio waves emitted by a transmitter are received by each receiver (or, history such as the traveling path or direction of a radio wave) under the assumption that the transmitter is disposed at an input position. There may be multiple transmitter positions, and simulation can be performed for only one transmitter position at a time.

The input required for a 5G wireless communication network simulation may include topographic information related to buildings or the like, information on the position of the transmitter, and information on the position of the receiver. In general, the topographic information and the receiver position information may be fixed, and simulation can be performed while changing the position information of the transmitter.

As a result of the simulation, the history of radio waves that are generated by the transmitter and are received by each receiver (traveling path and direction of a radio wave) may be output. Based on the result of the simulation, the user can identify the radio wave received by each receiver from the input position of the transmitter, and determine whether the position of the transmitter is appropriate. The user can execute a plurality of simulations to check the quality of the radio wave received by a specific receiver and to find the optimal transmitter position for communication between the transmitter and the receiver.

In addition, through the 5G wireless communication simulation, the user can know the path of the radio wave received by each receiver for the input position of the transmitter, and the user can effectively identify the optimal transmitter position with reduced time and cost compared to the existing experimental method of directly installing the transmitter.

Next, a description is given of a method and apparatus used by the simulator to analyze the radio wave environment in a wireless communication system, where the simulator may receive, as input, topographic information and position information indicating where a transmitter and a receiver can be located in the topographic information, generate rays for at least one direction, group the generated rays into at least one group based on the traveling path to configure the groups as computational units of the GPU, and analyze the radio wave environment based on the computational units of the GPU. When the rays are sequentially generated in the above process, the simulator can easily group the rays based on the traveling path.

In the following description on the radio wave environment analysis of the simulator according to the disclosure, ray generation and grouping will be described as a first embodiment, and workload distribution on plural GPUs will be described as a second embodiment.

The disclosure relates to a method for the simulator to analyze a radio wave environment but is not limited to specific methods for ray generation, ray grouping and workload distribution, and the disclosure can be carried out in various ways.

Figure 2:
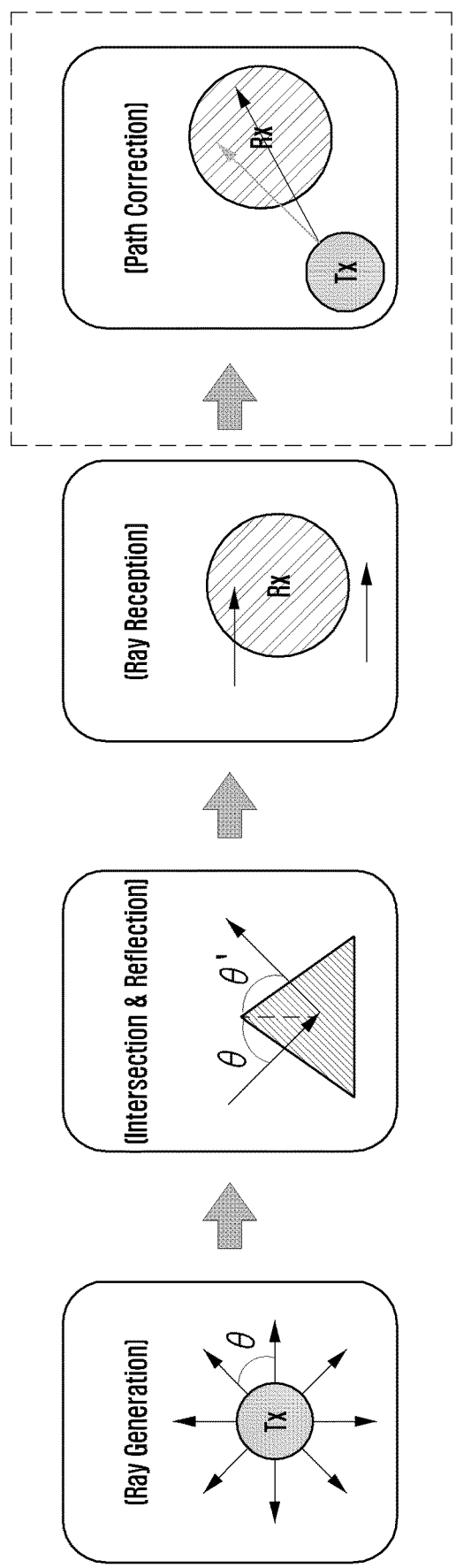
FIG. 2 is a diagram illustrating a ray tracing technique used in a simulation of a 5G wireless communication network.

FIG. 2 is a diagram illustrating a ray tracing technique used in a simulation of a 5G wireless communication network.

Ray tracing can be used for the simulator to effectively simulate a 5G wireless network system. A simulation of a 5G wireless communication network using ray tracing may be largely composed of four stages as shown in FIG. 2. However, the fourth stage (path correction) may be omitted.

The first stage is for ray generation. Rays may be generated from the origin of a sphere toward evenly distributed points. The generated rays are spaced apart by a specific interval from each other. The narrower the spacing between rays, the more accurate the simulation can be.

The second stage is for ray-object intersection and reflection test. In ray-object intersection and reflection test, the simulator can track each ray to check whether the ray intersects an object. The ray intersecting an object may generate a new reflection ray.

The third stage is for ray reception test. It is possible to check whether a ray generated by the transmitter and a reflection ray generated from the ray intersecting an object are received at each receiver. When a ray is received by a specific receiver, the reception power may be calculated.

The fourth stage is for path correction. This path correction stage may be selectively omitted in ray tracing. For a ray received at each receiver, the simulator may modify the direction vector of the ray so that the ray faces the center of the receiver. The simulator may use a mirror method to modify the direction vector of a ray. The mirror method creates a virtual receiver at a position different from the position of an actual receiver so that the ray from the transmitter faces the center of the receiver. By using the mirror method, the simulator can improve the accuracy of the 5G wireless communication network simulation.

However, in a 5G wireless communication network simulation using ray tracing, because the number of rays increases as the generation interval of rays is denser, the amount of computation for the simulation may increase exponentially. In addition, when the number of buildings and receivers increases in the environment for which the simulation is performed, the amount of computation may increase exponentially. Since this affects the performance of the simulation, a large amount of computational power may be required to perform the simulation.

The GPU is a piece of hardware for computer graphics and has been developed as dedicated hardware for large-scale graphics processing that is difficult for the existing CPU to compute. The GPU is designed to significantly increase the number of arithmetic logic units (ALUs) to increase the parallel processing capability. As the programming of the GPU becomes easier and the GPU includes all the common arithmetic functions, to utilize the features of the GPU capable of massively parallel processing, the concept of general purpose computing on graphics processing units (GPGPU) has been introduced to use GPUs to perform computations in areas requiring large-scale computing power such as supercomputing. This allows hundreds of times more computational performance compared to the CPU at the same power consumption level, making it possible to greatly reduce the simulation execution time by using the GPU in a 5G wireless network simulation.

As rays are independent of each other in a 5G wireless communication network simulation, it is possible to improve the performance of the simulation by using the feature of the GPU being capable of large-scale parallel processing. In addition, the use of plural GPUs in a wireless communication network simulation can further improve the performance of the simulation.

Accordingly, the disclosure proposes a method and apparatus for analyzing a radio wave environment where the performance of a wireless communication network simulation is improved by using a GPU. There can be schemes for improving the simulation performance, where a first scheme is ray grouping in which the simulator performs operations by grouping adjacent rays into one group and a second scheme is workload balancing in which the simulator distributes similar amounts of workload to multiple GPUs.

In the first embodiment of the disclosure, a description is given of ray grouping as a scheme for accelerating the wireless communication simulation using a GPU. The GPU can simultaneously execute 32 or 64 threads as a bundle called a warp or wavefront. However, if the threads in the warp/wavefront have different flows of instruction execution due to a branch statement, the execution of the warp or wavefront may be serialized, reducing the throughput. To prevent this, threads with the same flow of instruction execution can be bundled into a single warp or wavefront for computation. This may be called parallel processing of the GPU.

If individual threads in a GPU thread group follow the same flow of execution, computational efficiency of the GPU may increase. In addition, even if not all threads in a warp follow absolutely the same travelling path, rays travelling along similar paths can be grouped into one warp as much as possible to thereby minimize serialization of the execution stream.

FIG. 3 is a diagram depicting a situation where the GPU groups adjacent rays into at least one group for computation according to the first embodiment of the disclosure.

Figure 3A:
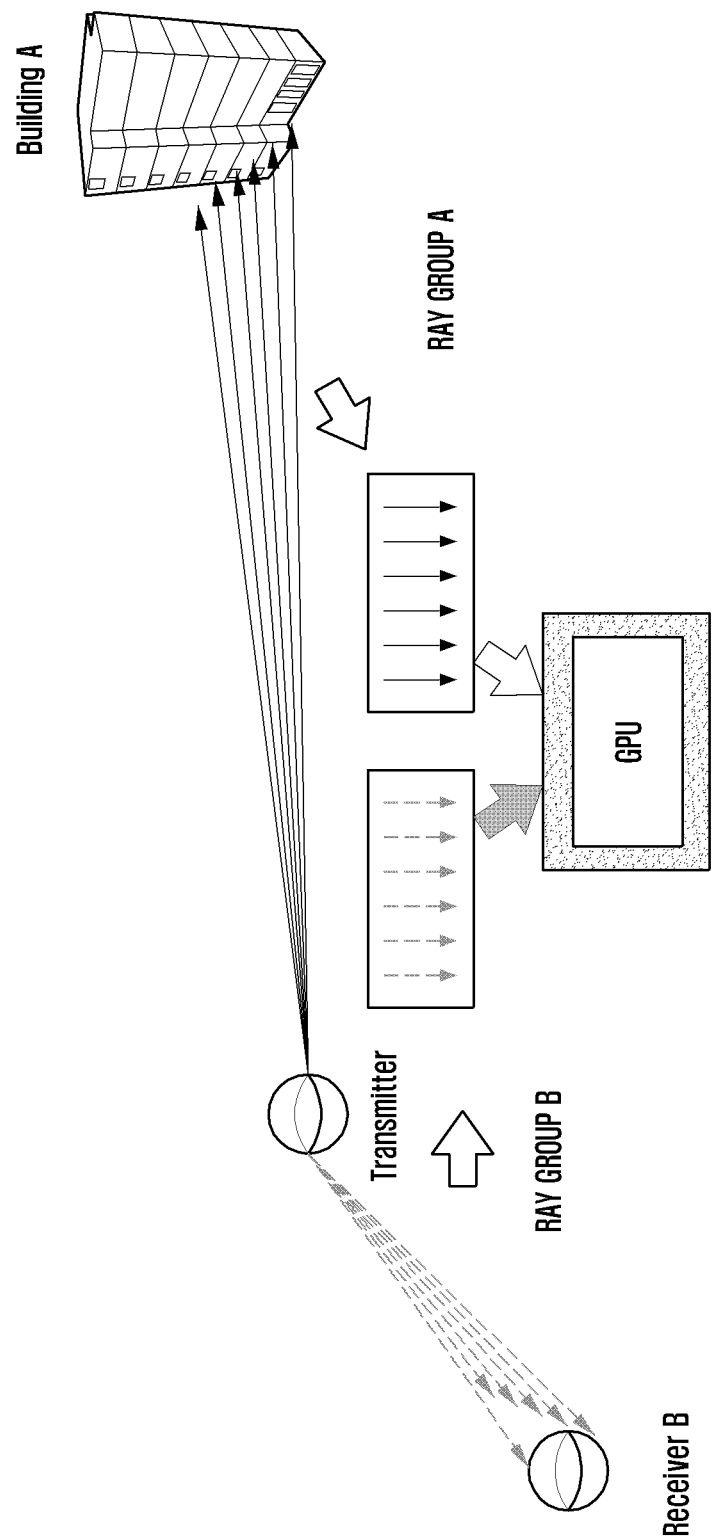
FIG. 3A is a diagram depicting a situation where the GPU groups adjacent rays into at least one group for computation according to a first embodiment of the disclosure.

In FIG. 3, the GPU performs computation by using ray groups. Rays may be grouped based on their traveling paths. It can be seen from FIG. 3A that the traveling paths of ray group A and ray group B are different. It can also be seen that the traveling paths of the rays belonging to each group are similar.

The GPU may perform operations for each group. That is, the GPU may perform operations necessary to simulate only the rays belonging to ray group A, and may perform operations necessary to simulate only the rays belonging to ray group B. The simulation for ray group A and the simulation for ray group B may be sequentially performed on one GPU.

In the case of performing operations to track the traveling paths of rays having similar traveling paths, the type and order of executed instructions may be similar or identical. Hence, when the operations to track the traveling paths of the rays in the group are simultaneously performed, the same instructions may be executed at the same timing. When operations internal to the group are performed, the parallel processing of the GPU in which the same instructions are executed at the same timing can be utilized, increasing the computational efficiency of the GPU.

Although it may be difficult to precisely group rays that intersect the same object into one group before analyzing the radio wave environment through simulation, according to the first embodiment of the disclosure, it is possible to increase the computational efficiency of the GPU by making the most of the GPU parallel processing.

Figure 3B:
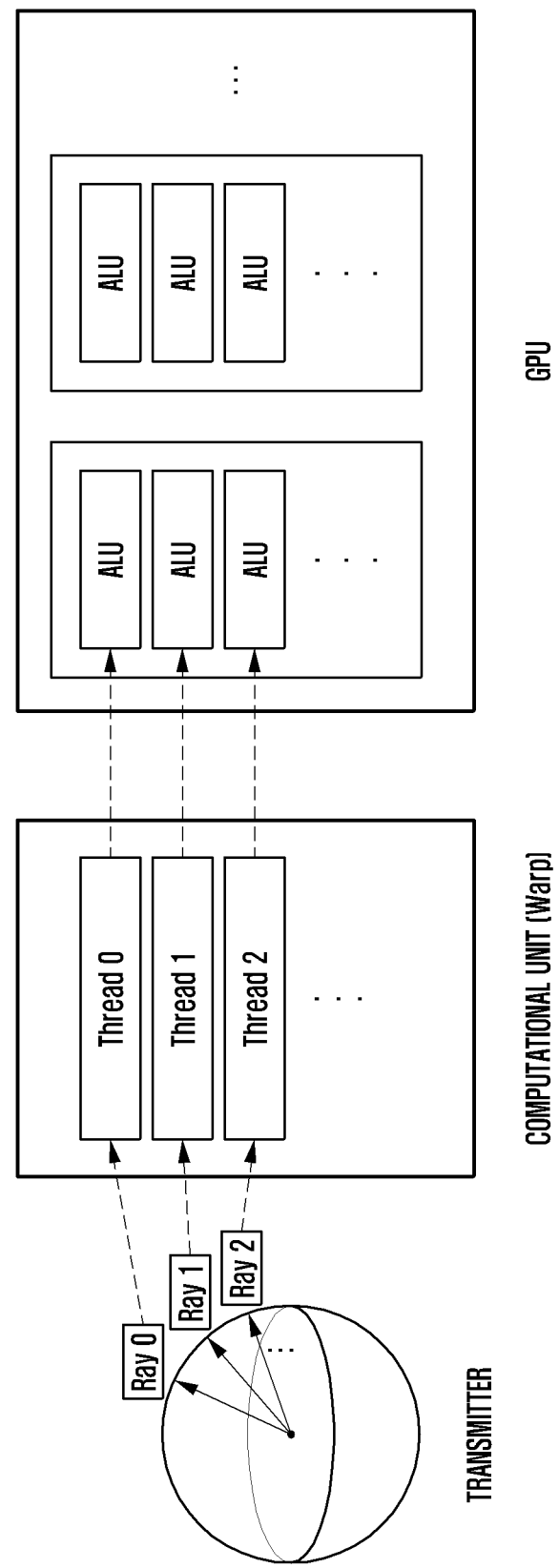
FIG. 3B is a diagram depicting a situation where rays are mapped to threads and calculated in ALUs of the GPU according to an embodiment of the disclosure.

FIG. 3B is a diagram depicting a situation where rays are mapped to threads and calculated in ALUs of the GPU according to an embodiment of the disclosure.

It can be assumed that virtual rays are generated at the transmitter of the simulator. Each of the generated rays can be mapped to a thread, and the thread can perform operations to track the path of the mapped ray. For example, ray 0 may be mapped to thread 0, and operations for tracking the traveling path of ray 0 may be processed by thread 0.

The thread to which a ray is mapped may be assigned to an ALU inside the GPU for execution. The ALU may refer to a device that processes instructions in the GPU. The thread may be scheduled on an ALU by the GPU scheduler and may be processed by the ALU.

In the above description, a thread may refer to a list of plural instructions. The computational unit of the GPU (warp or wavefront) may include a plurality of threads. As the GPU can perform operations for each computational unit, plural threads belonging to one computational unit may be assigned to individual ALUs and executed at the same time.

As described above, executing the instructions of assigned threads by the ALUs of the GPU at the same time may be referred to as parallel processing of the GPU. The use of the GPU parallel processing may increase the computational efficiency of the GPU. In addition, when the ALUs process the same instructions at the same timing, the threads in the computational unit may share a control signal, increasing the computational efficiency of the GPU and improving the simulation performance.

Now, the example of FIG. 3B may be described as follows. It can be assumed that the transmitter of the simulator generates virtual rays such as ray 0, ray 1 and ray 2. It can also be assumed that the above rays are grouped into a single group due to their similar traveling paths.

Each ray may be mapped to one thread. That is, ray 0 may be mapped to thread 0, ray 1 may be mapped to thread 1, and ray 2 may be mapped to thread 2. Then, threads 0, 1 and 2 may be configured as a computational unit of the GPU.

When the above computational unit is executed on the GPU, each thread can execute instructions on the assigned ALU. That is, thread 0, thread 1, and thread 2 may be assigned respectively to the ALUs, and the ALUs to which the threads are assigned may simultaneously execute the same instructions. Hence, operations that track the paths of the rays mapped to the threads may be executed at the same timing.

In the above process, as the traveling paths of ray 0, ray 1, and ray 2 are similar, the instructions of the operations to track the paths of the rays may be similar or the same. Also, it can be seen that the same instructions are processed on the ALUs of the GPU at the same timing.

On the other hand, if the traveling paths of ray 0, ray 1, and ray 2 are all different in the above process, the instructions of the operations for tracking the ray paths may be different. As the instructions executed on the ALUs of the GPU are different, before the operation for tracking the traveling path of ray 0 is terminated, the operation for tracking the traveling path of the remaining rays may be not performed, so the computational efficiency of the GPU may be deteriorated.

Therefore, it can be seen that when rays are generated and grouped to have similar traveling paths, the simulator can utilize the parallel processing of the GPU to improve the computational efficiency of the GPU and the simulation performance.

Figure 4:
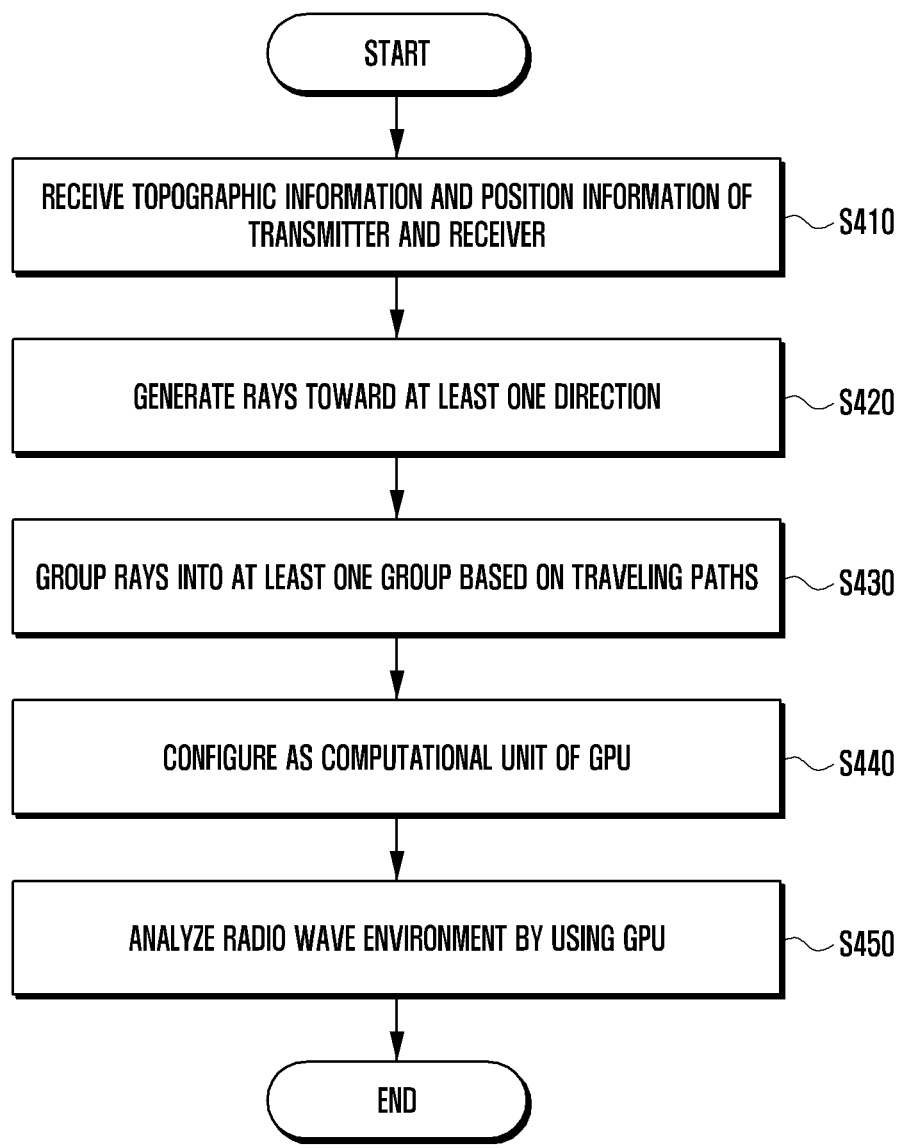
FIG. 4 is a flowchart of a method for analyzing a radio wave environment according to the first embodiment of the disclosure.

FIG. 4 is a flowchart of a method for analyzing a radio wave environment according to the first embodiment of the disclosure.

The operation according to the first embodiment of the disclosure may be briefly described as follows. The simulator may first receive topographic information and position information indicating where a transmitter and a receiver can be located in the topographic information. The simulator may generate rays from the transmitter disposed at a position given by the position information toward at least one direction of a sphere having a constant radius. The simulator may group the generated rays into at least one group based on the traveling path. The simulator may configure the groups as a computational unit of the GPU. The simulator may analyze the radio wave environment by using the GPU on which the computational unit is configured.

In FIG. 4, not every step is essential, and a certain step may be omitted. The operation according to the disclosure is described in detail with reference to FIG. 4 and subsequent drawings.

At step S410, the simulator may receive topographic information and position information indicating where a transmitter and a receiver can be located in the topographic information. Based on the topographic information, the simulator may determine whether a ray generated by a virtual transmitter is received at a receiver and output the traveling path of a ray received at the receiver.

The simulator may receive information on the positions of plural receivers as input, but the position of the transmitter may be limited to one per simulation. The user of the simulator can determine whether the position of the transmitter is suitable based on the result of the simulation.

At step S420, the simulator may generate rays toward at least one direction of a sphere having a constant radius from the transmitter disposed at a position given by the position information with the transmitter as the origin of the sphere. The generated ray may be not a physical radio wave but may be a virtual radio wave generated by the simulator. The ray generation scheme will be described in detail with reference to FIGS. 5 to 7. The rays may be sequentially generated and may be generated so that adjacent rays have similar traveling paths. Thereby, as the rays having similar traveling paths are assigned to the same group, the simulator can simultaneously track traveling paths of multiple rays, improving the simulation performance.

At step S430, the simulator may group the generated rays into one or more groups based on their traveling paths. The simulator may sequentially assign ID numbers from 0 to the generated rays according to the generation order. The simulator can group the rays into groups with a given number of rays. As the angle between adjacent rays in one group is small, the traveling paths of the rays in the group may become similar to each other.

In the disclosure, 4 to 64 rays can be grouped into one group. For example, assuming that 32 rays form one group, to group the generated rays, the simulator may group the rays with IDs 0 to 31 into one group, may group the rays with IDs 32 to 63 into another group, and so on. In addition, the traveling paths of the 32 rays in one group may be similar to each other.

At step S440, the simulator may configure the groups as a computational unit (warp or wavefront) of the GPU. In the GPU, multiple threads belonging to the same computational unit can execute the same instructions at the same timing. The threads in the computational unit can share a control signal and can be executed on different ALUs.

A ray belonging to the group may be mapped to a thread of the computational unit, and an ALU of the GPU can execute instructions to track the path of the ray. As the ray and an adjacent ray belonging to the group have similar traveling paths, the instructions for tracking the traveling paths of the rays may be the same, and the same instructions may be executed by the ALUs of the GPU at the same timing. Hence, the simulator can simultaneously track propagation paths of adjacent rays in the group.

In addition, even if the traveling paths of all rays belonging to the group are not the same, it is possible to minimize the serialization of the execution stream in the GPU. The serialization of the execution stream in the GPU may indicate that, because the traveling paths of the rays mapped respectively to threads are different, the ALUs of the GPU cannot process the same instructions at the same timing and may have to perform operations to track the traveling path of one ray and then perform operations to track the traveling path of another ray in sequence.

As the transmitter of the simulator can sequentially generate rays with a constant angle, the rays in one group can be a bundle of adjacent rays. Hence, rays having a traveling path similar to the traveling path of the ray generated first in the group can be distinguished from other rays. As other rays can be distinguished by the above method, rays in the group can be classified into bundles of rays having similar traveling paths. Based on the above process, serialization of the execution stream in the GPU can be minimized.

At step S450, the simulator may analyze the radio wave environment by using the GPU in which the computational unit is configured. The thread of the GPU can perform operations for tracking the path of a ray by using the ALU. As the operations for tracking the paths of rays having similar traveling paths include the same instructions to be executed, the GPU can simultaneously perform the operations for tracking the traveling paths of plural rays by using the ALUs.

When the operations for the rays are performed in parallel, the computational efficiency of the GPU may be increased. In addition, as the computational efficiency of the GPU increases, the speed of radio wave environment analysis through ray tracing may be increased.

The method for the simulator to perform a simulation of a wireless communication network through ray tracing can be described in detail with reference to FIG. 8A.

Figure 5:
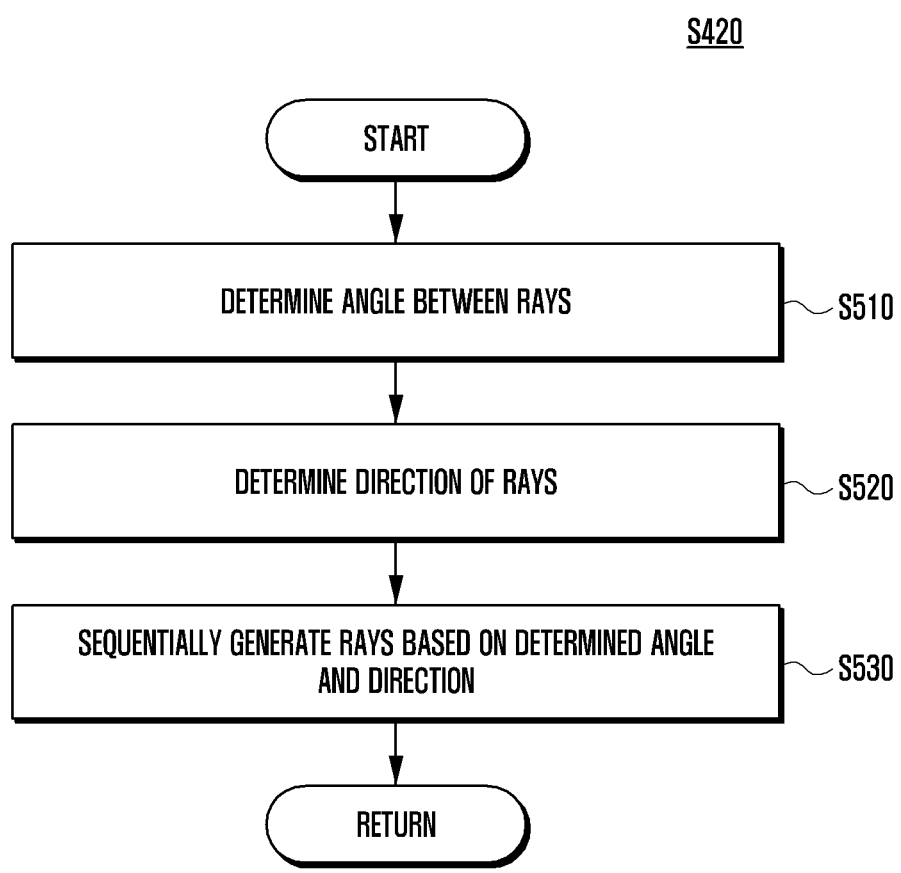
FIG. 5 is a flowchart of a method for generating rays in at least one direction according to the first embodiment of the disclosure.

FIG. 5 is a flowchart of a method for generating rays in at least one direction according to the first embodiment of the disclosure.

The method for generating rays in at least one direction according to the first embodiment of the disclosure may be summarized as follows. The simulator may determine the angle and direction of virtual rays to be generated. Then, the simulator can sequentially generate virtual rays according to the determined angle and direction. The operation according to the first embodiment of the disclosure is described in detail with reference to FIG. 5 and subsequent drawings.

At step S510, the simulator may determine the angle of the rays to be generated. With a small angle, the spacing between rays becomes smaller and the number of rays to be simulated becomes larger, increasing the accuracy of the radio wave environment analysis of the simulator. In addition, as the spacing becomes smaller, the traveling paths of adjacent rays becomes similar, enabling the GPU to make the most of parallel computations.

At step S520, the simulator may determine the direction of rays to be generated. The simulator may determine the direction of rays so that the rays can be generated in sequence.

Specifically, a sphere having a constant radius from the transmitter of the simulator serving as the origin may be formed. Virtual rays can be generated from the origin of the sphere toward the surface of the sphere.

The simulator may configure a plane parallel to the plane defined by any two axes of the three directional axes forming the sphere. For convenience, the three directional axes can be viewed as the X-axis, the Y-axis, and the Z-axis. The simulator may set such planes at any interval from the contact point with the sphere to the opposite contact point.

The simulator can identify a circle formed by the intersection between the sphere and the plane. The simulator may determine the direction of rays to be generated to be a direction from the transmitter toward the circumference of the circle.

At step S530, the simulator can sequentially generate rays based on the determined angle and direction. When rays are generated in the determined direction, the simulator may generate a ray in a direction incremented by the determined angle.

The simulator may generate rays along the circumference of the circle. When a ray generated along the circumference of the circle overlaps with an already generated ray, the simulator may repeat the process of ray generation along the circumference of another circle adjacent to the circle and not used for ray generation.

Hence, the simulator can sequentially generate rays adjacent to each other. The generated rays may be evenly distributed on the surface of the sphere.

Figure 6:
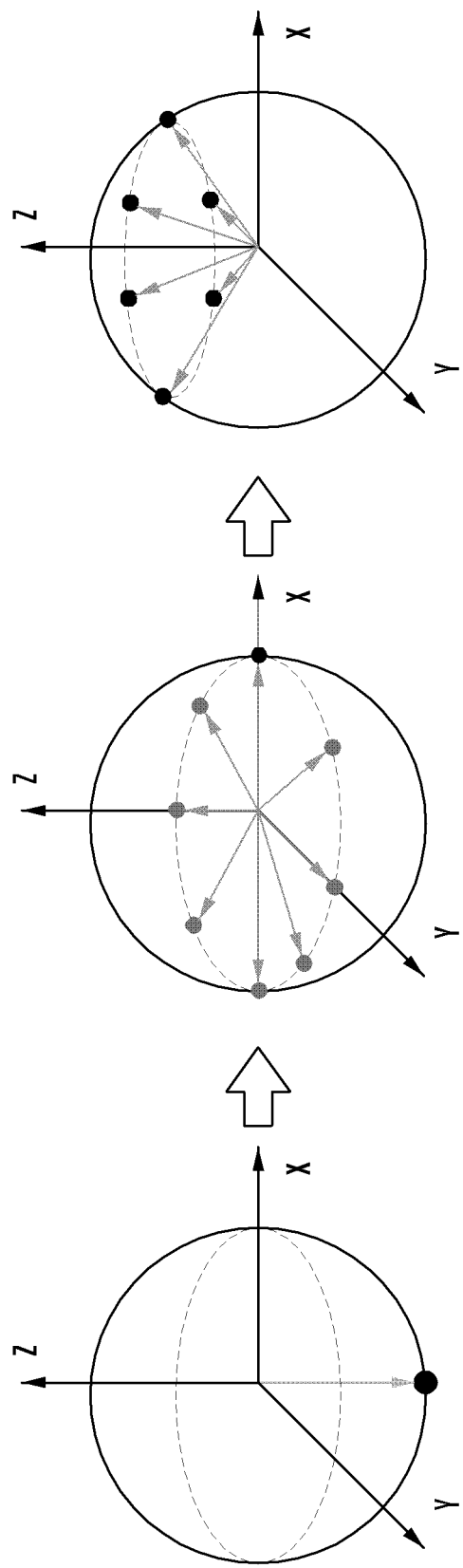
FIG. 6 is a diagram depicting a scheme for generating rays in a direction toward a circle resulting from the intersection between a sphere having a constant radius and a plane parallel to the plane formed by two axes according to the first embodiment of the disclosure.

FIG. 6 is a diagram depicting a scheme for generating rays in a direction toward a circle resulting from the intersection between a sphere having a given radius and a plane parallel to the plane given by two axes according to the first embodiment of the disclosure.

In FIG. 6, the radius of the sphere is set to 1, and planes parallel to the xy plane are assumed at a specific interval from z=−1 to z=1. It can also be assumed that the angle between rays to be generated is a constant value. Assuming that the transmitter is the origin of the sphere, virtual rays may be generated from the transmitter toward a circle formed by the intersection between the sphere and the plane.

A specific ray generation method will be described below as an example. The plane with z=−1 and the sphere may have a contact point. Here, one virtual ray is generated in the direction from the origin toward the point (0, 0, −1). This case is depicted in the left part of FIG. 6.

When the z value of the xy plane increases, the sphere and the plane may form a circle rather than a contact point. Virtual rays may be generated from the origin toward the circumference of the circle. In this case, the method of ray generation is the same as that of z=0 below, so it will be described below.

The case where z=0 after increasing the z value may be described as follows. The transmitter may generate rays in sequence such as (0.984, 0.173, 0), (0.939, 0.342, 0), (0.866025, 0.5, 0), . . . , (0, 1, 0) by decreasing the x value and increasing the y value from the direction vector (1, 0, 0) while maintaining a constant angle. Then, the transmitter may generate rays in sequence such as (−0.173, 0.984, 0), . . . , (−1, 0, 0) by increasing the x value and decreasing the y value from the direction vector (0, 1, 0). In this way, the transmitter may sequentially generate rays along the circumference of the circle until a newly generated ray overlaps an already generated ray. This case is depicted in the middle part of FIG. 6.

When 0<z<1, rays can be generated in sequence as in the case of z=0. This case is depicted in the right part of FIG. 6.

Figure 7:
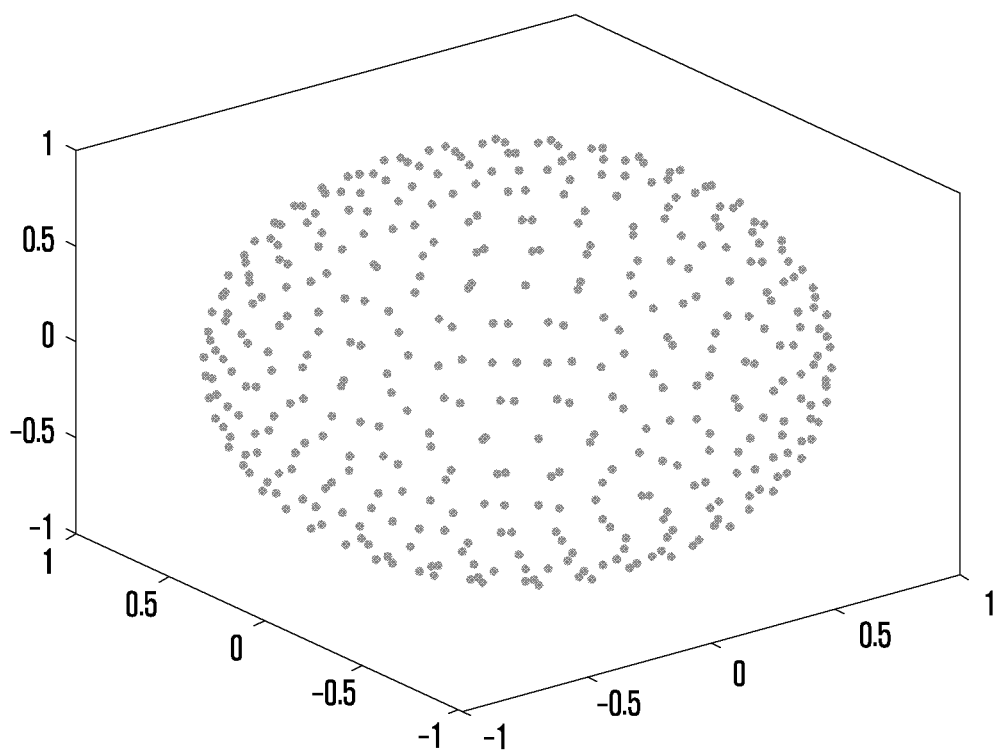
FIG. 7 is a diagram showing a result of generating rays by setting a specific angle according to the first embodiment of the disclosure.

FIG. 7 shows a result of generating rays by setting a specific angle according to the first embodiment of the disclosure. The sphere has a radius of 1, and (0, 0, 0) is the center of the sphere. The simulator may generate one virtual ray from the origin of the sphere toward a point marked on the surface of the sphere.

The rays can be generated uniformly toward the surface of the sphere, and adjacent rays may be spaced apart by a specific distance from each other. As the spacing between rays becomes smaller, the number of rays to be simulated increases and the accuracy of the radio wave environment analysis of the simulator can be increased. In addition, as the spacing becomes smaller, the traveling paths of adjacent rays become similar, so that the parallel processing of the GPU can be utilized to the maximum.

Figure 8A:
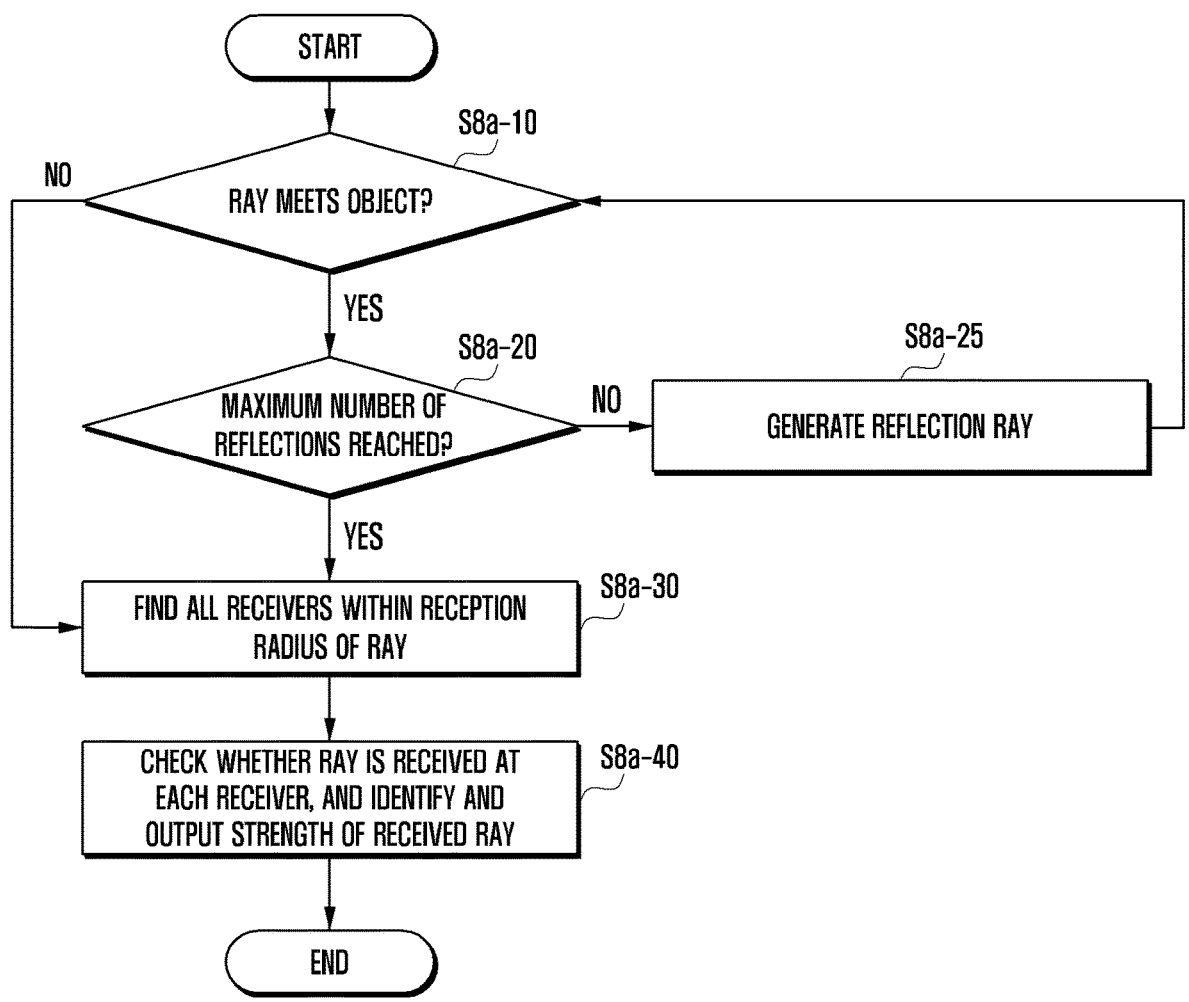
FIG. 8A is a flowchart of a method for the simulator to perform a simulation of a wireless network through ray tracing according to an embodiment of the disclosure.

FIG. 8A is a flowchart of a method for the simulator to perform a wireless communication network simulation through ray tracing according to an embodiment of the disclosure.

Now, a brief description is given below of a method for performing a wireless communication network simulation through ray tracing according to an embodiment of the disclosure. The simulator may check whether a generated ray intersects an object. The simulator may examine the number of reflections of the ray and, if the maximum number of reflections has been reached, the simulator may find all receivers within the reception radius of the ray. The simulator may check whether the ray is received at the receiver and may identify and output the strength of the received ray. The above operation according to the embodiment of the disclosure is described in detail with reference to FIGS. 8A and 8B.

At step S8a-10, the simulator may check whether a generated ray intersects an object. A GPU thread of the simulator may perform an operation for tracking the path of each ray, and the simulator may perform ray-object intersection test. The simulator may track a generated virtual ray to check whether the ray intersects an object.

At step S8a-20, the simulator may check whether the maximum number of reflections has been reached for the ray. Upon determining that the ray intersects an object, the simulator may check whether the ray generates a reflection ray. If the maximum number of reflections has not been reached for the ray, the procedure proceeds to step S8a-25.

At step S8a-25, the simulator may generate a reflection ray for the ray. Steps S8a-10 and S8a-20 may be repeated until the maximum number of reflections is reached. That is, the generated virtual ray may intersects an object and generates a reflection ray until the maximum number of reflections is reached or may travel without intersecting an object and be received at a receiver.

At step S8a-30, the simulator may search for a receiver within the reception radius of the ray. The receiver may check whether the ray is received, and this may be used by the simulator to track the path of the ray generated by the transmitter and the ray generated through reflection.

At step S8a-40, the simulator may check whether a ray is received at each receiver and may identify and output the strength of the received ray. The simulator can track the ray generated by the transmitter and the ray generated through reflection by checking whether a ray is received at each receiver.

The process of checking whether a ray is received by a receiver is described in detail with reference to FIG. 8B below. The simulator can perform a wireless communication network simulation by tracking the paths of rays. The simulator can analyze the radio wave environment based on the simulation.

Meanwhile, the reception check may refer to a process of tracking a ray generated by the transmitter and a reflection ray reflected by an object and checking whether the ray is received at a receiver. In the reception check process, whether a ray is received by a receiver may be determined based on a reception sphere.

Figure 8B:
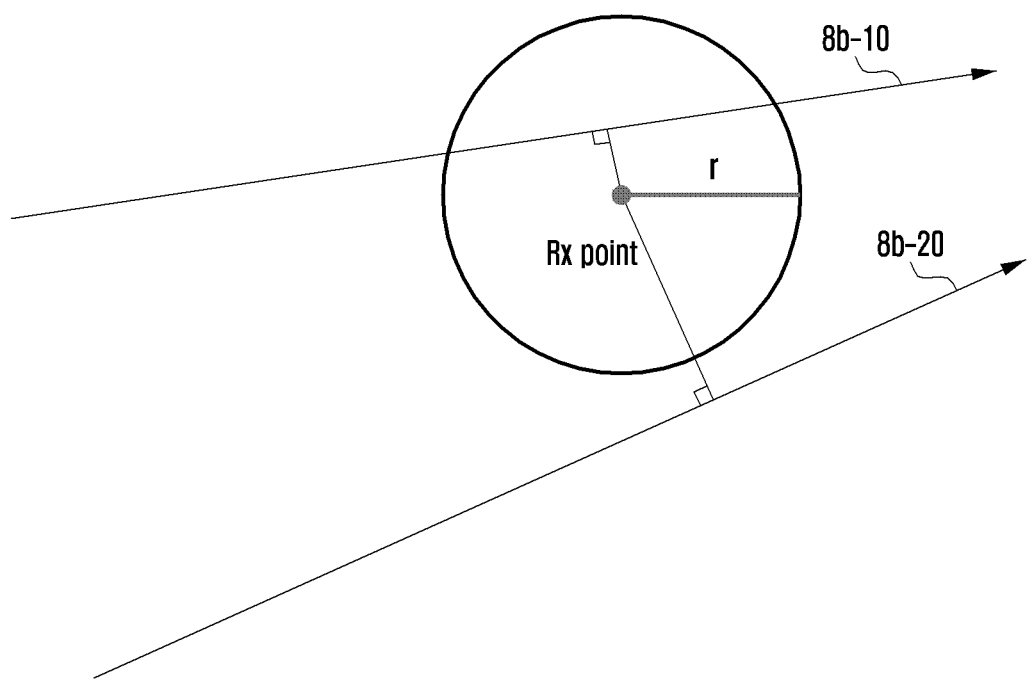
FIG. 8B is a diagram depicting a scheme for a receiver of the simulator to check whether a specific ray is received according to an embodiment of the disclosure.

FIG. 8B is a diagram depicting a scheme for the receiver of the simulator to check whether a ray is received according to an embodiment of the disclosure.

In FIG. 8B, the position of the receiver may be represented by an Rx point. Then, a sphere whose radius is r can be formed with the receiver as the origin. When a virtual ray passes through the inside of the reception sphere, it can be determined that the ray has been received by the corresponding receiver.

In FIG. 8B, as a ray 8b-10 passes through the inside of the sphere having a radius r set from the receiver position (RX point), it can be determined that the ray 8b-10 has been received by the receiver. On the other hand, as a ray 8b-20 passes through the outside of the sphere, it can be determined that the ray 8b-20 has not been received by the receiver.

The radius of the reception sphere can be set in proportion to the distance the ray travels. That is, the radius of a reception sphere for receiving a ray traveling a long distance can be set to a large value in proportion to the traveling distance, and the radius of a reception sphere for receiving a ray traveling a short distance may be set to a small value in proportion to the traveling distance.

Because the distance between adjacent rays gradually increases as the rays travel, the radius of the reception sphere can be set in proportion to the traveling distance of the ray. If the radius of the reception sphere is fixed, the farther the ray is from the transmitter, the more it may be not received by the receiver. Hence, for the receiver to receive rays traveling a long distance, the radius of the reception sphere can be set to be proportional to the traveling distance of the ray.

In the second embodiment of the disclosure, workload balancing will be described as a method for accelerating the simulation of a wireless communication network by using plural GPUs. When a plurality of GPUs are used, as the amount of computation is distributed to the individual GPUs, the simulation performance may be improved. However, the performance is not always improved by a multiple of the number of GPUs, and the simulator should distribute the same amount of workload to individual GPUs to ideally improve the performance.

When the amounts of workload assigned to the GPUs are different, the execution times of the GPUs may be different and the GPU that has completed the task early may be in the idle state. The GPU in the idle state may be unable to perform operations until the tasks of other GPUs are completed, so the performance of the simulation may be deteriorated.

Hence, when the simulator distributes the workload evenly to the GPUs, the multiple GPUs can perform calculations without transitioning to the idle state, improving the performance of the simulation. Even if the simulator cannot assign exactly the same amount of workload to the GPUs, it is possible to minimize the idle states of the GPUs by assigning similar amounts of workload.

Figure 9:
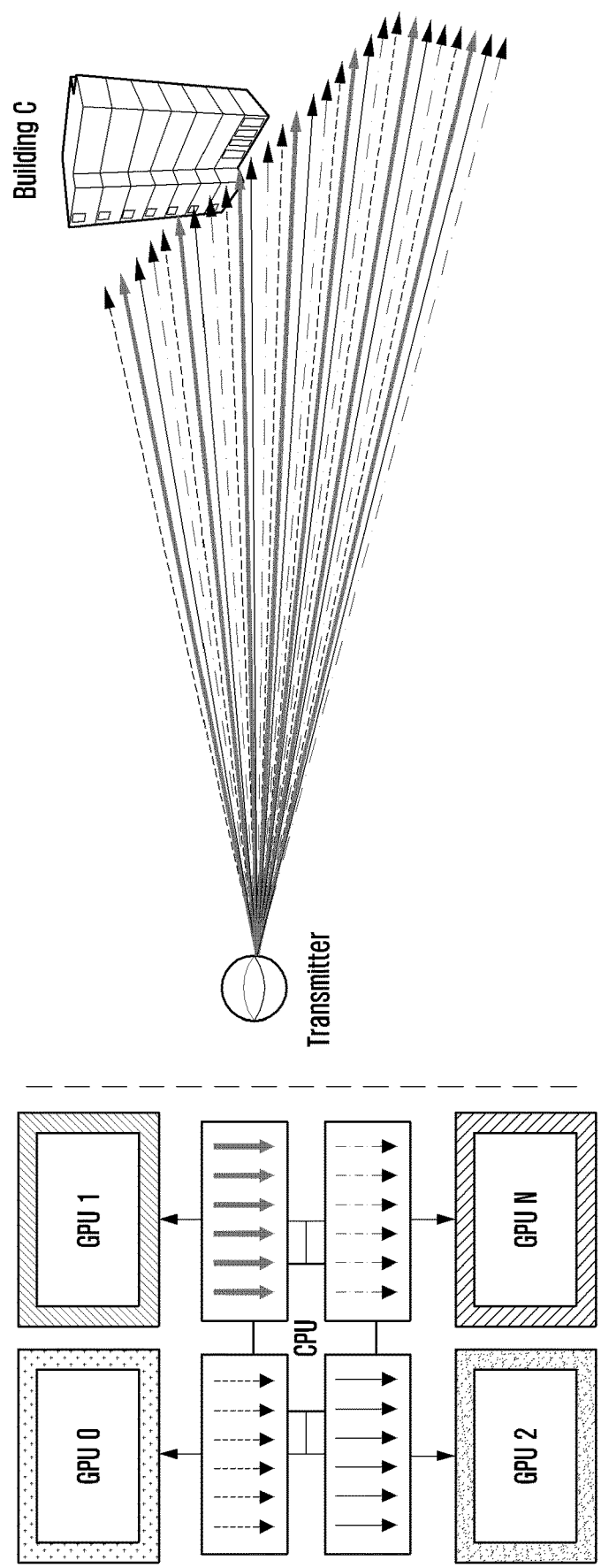
FIG. 9 is a diagram illustrating a scheme for assigning rays to plural GPUs according to a second embodiment of the disclosure.

FIG. 9 is a diagram illustrating a scheme for assigning rays to plural GPUs according to a second embodiment of the disclosure.

FIG. 9 illustrates a case where the simulator performs operations by assigning generated rays to plural GPUs. The rays may be assigned to the plural GPUs based on the GPU workload. In FIG. 9, the simulator sequentially assigns virtual rays generated in sequence to the plural GPUs while repeatedly circulating the GPUs until all the rays are assigned to the GPUs.

The rays assigned to GPU 0 in FIG. 9 may be described as follows. It can be seen that the rays sequentially generated by the transmitter of the simulator are assigned to GPU 0 while being separated by the number of GPUs.

For example, it can be assumed that the number of GPUs is 4 and the rays sequentially generated by the transmitter are numbered from 0. Then, it can be seen that ray 0, ray 4, ray 8, etc. are assigned to GPU 0, and ray 1, ray 5, ray 9, etc. are assigned to GPU 1.

In addition, as the transmitter sequentially generates dense virtual rays, it can be seen that adjacent rays have similar traveling paths. As described above in the first embodiment, when the traveling paths are similar, the same instructions can be processed by the ALUs of the GPU to track the traveling paths of the rays. As the same instructions are processed in the GPUs, the amounts of workload of operations to track the traveling paths of adjacent rays can be the same or similar.

Hence, when the simulator assigns the sequentially generated rays to the plural GPUs while circulating the GPUs, the amounts of workload on the GPUs may become the same or similar. Although exactly the same workload cannot be assigned to the individual GPUs before analyzing the radio wave environment through simulation, it is possible to increase the simulation performance by minimizing the idle state of the GPUs according to the second embodiment of the disclosure.

Figure 10:
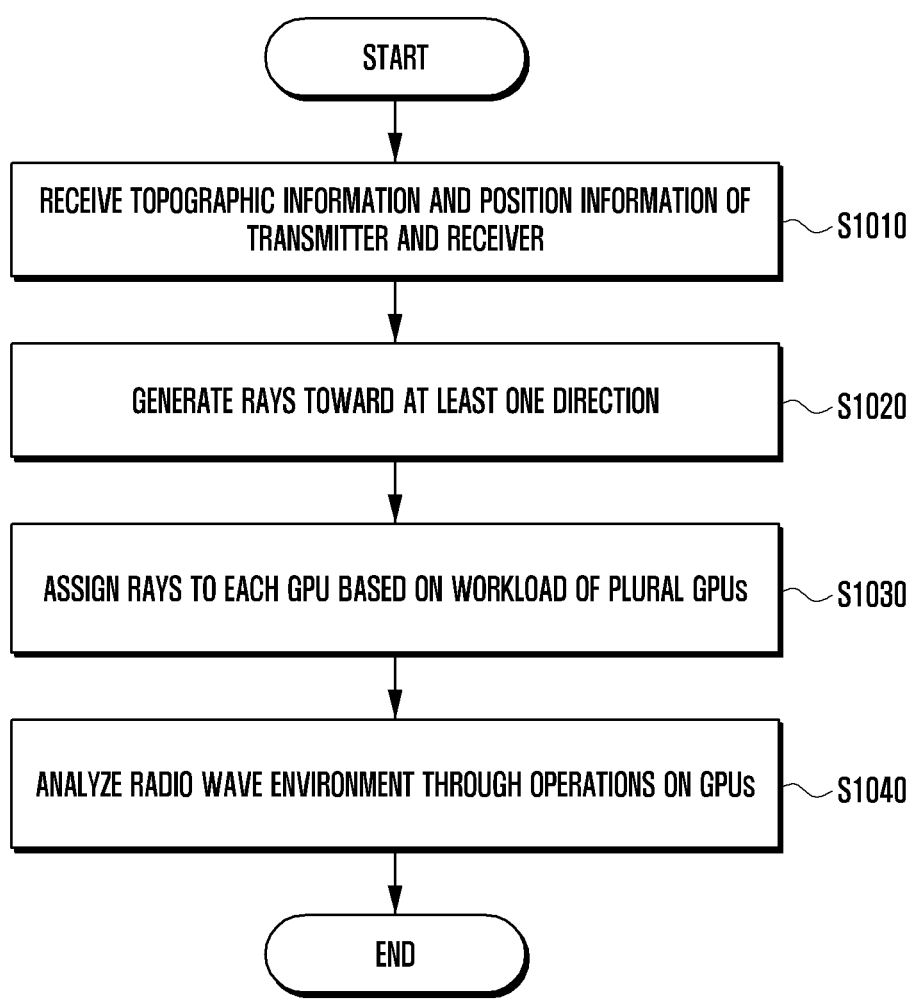
FIG. 10 is a flowchart of a method for analyzing a radio wave environment according to the second embodiment of the disclosure.

FIG. 10 is a flowchart of a method for analyzing a radio wave environment according to the second embodiment of the disclosure.

The method of analyzing a radio wave environment according to the second embodiment of the disclosure may be briefly described as follows. The simulator may receive topographic information and position information indicating where a transmitter and a receiver can be located in the topographic information. The simulator may generate rays from the transmitter disposed at a position given by the position information toward at least one direction of a sphere having a constant radius. The simulator may assign the generated rays to the plural GPUs based on the workload of each GPU. Then, the simulator may analyze the radio wave environment by performing operations through the GPUs.

In FIG. 10, not every step is essential, and a certain step may be omitted. The operation according to the disclosure is described in detail with reference to FIG. 10 and subsequent drawings.

At step S1010, the simulator may receive topographic information and position information indicating where a transmitter and a receiver can be located in the topographic information. The reception of the topographic information and position information may correspond to step S410 in FIG. 4.

At step S1020, the simulator may generate rays toward at least one direction of a sphere having a constant radius from the transmitter disposed at a position given by the position information with the transmitter as the origin of the sphere. The generated ray may be not a physical radio wave but may be a virtual radio wave to be generated by the simulator. The above ray generation method may correspond to the ray generation method in the first embodiment, which has been described in detail with reference to step S420 in FIG. 4 and FIGS. 5 to 7. The rays may be sequentially generated and may be generated so that adjacent rays have similar traveling paths.

At step S1030, the simulator may assign the generated rays to the plural GPUs based on the workload of each GPU. The simulator may sequentially assign rays generated in sequence to the plural GPUs and may perform ray assignment by repeatedly circulating the GPUs until all the rays are assigned to the GPUs. In each GPU, the rays sequentially generated by the transmitter of the simulator may be assigned while being separated by the number of GPUs.

As the transmitter sequentially generates rays, it can be seen that the generated rays and adjacent rays have similar traveling paths. When the traveling paths are similar, the same instructions can be processed by the ALUs of the GPU, so that the amounts of workload on the GPUs to track the traveling paths of rays can be the same or similar. Hence, when the simulator assigns the sequentially generated rays to the individual GPUs while repeatedly circulating the GPUs, the amounts of workload on the GPUs may become the same or similar.

In addition, when the same amount of workload is distributed to the GPUs, the GPUs can perform calculations without transitioning to the idle state, so that the performance of the simulator may be enhanced. On the other hand, when the amounts of workload of the GPUs are different, the execution times of the GPUs may become different. The GPU that has completed the task early may transition to the idle state and wait until the tasks of other GPUs are completed, so the performance of the simulator may be deteriorated.

At step S1040, the simulator can analyze the radio wave environment by performing operations on the GPUs. As the rays generated by the simulator are assigned to each GPU, the simulator can analyze the radio wave environment through operations that track the traveling paths of the rays on the GPUs. The method in which the simulator analyzes the radio wave environment by using the rays assigned to the individual GPUs may correspond to the first embodiment.

The details are as follows. The ray and adjacent ray assigned to each GPU may still have similar traveling paths. Hence, when analyzing the radio wave environment using ray tracing on the GPUs, ray grouping of the first embodiment may be applied.

The method for the simulator to perform a wireless communication network simulation through ray tracing has been described in detail with reference to FIG. 8A.

Figure 11:
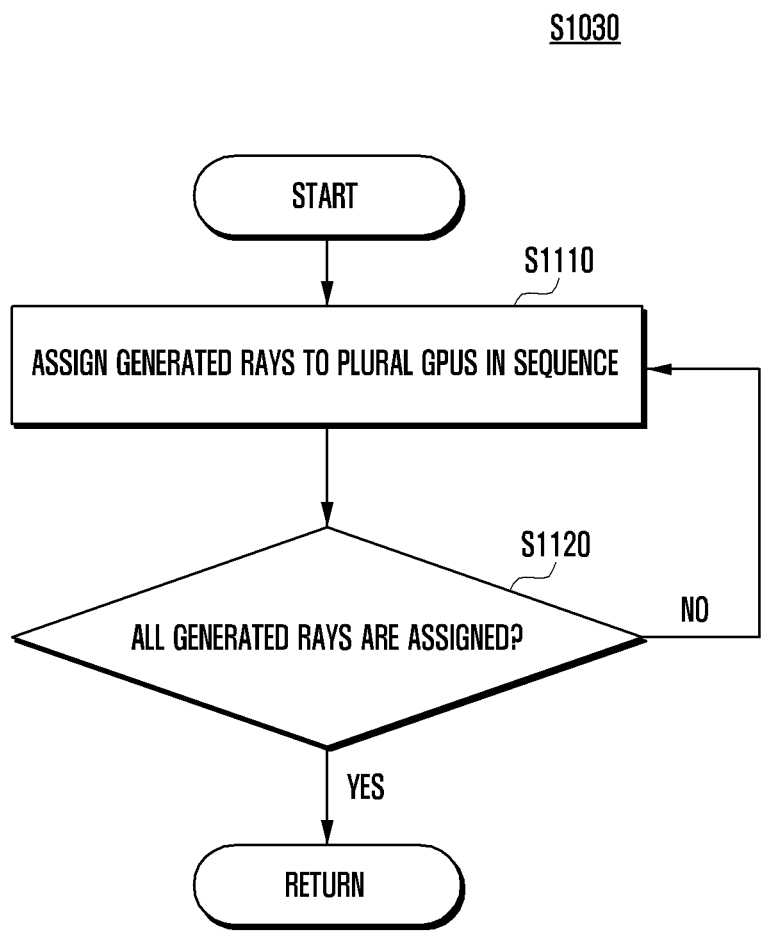
FIG. 11 is a flowchart of a method for assigning rays to plural GPUs according to the second embodiment of the disclosure.

FIG. 11 is a flowchart of a method for assigning rays to plural GPUs according to the second embodiment of the disclosure.

The method of assigning rays to plural GPUs according to the second embodiment of the disclosure may be described in brief as follows. The simulator can assign the generated rays to the plural GPUs in sequence. The simulator can check whether all the generated rays are assigned to the GPUs. Until all the rays are assigned to the GPUs, the simulator can repeatedly assign rays to the GPUs.

At step S1110, the simulator may assign the rays generated at step S1010 to the plural GPUs in sequence. Since the rays are sequentially generated by the transmitter of the simulator, adjacent rays may have similar traveling paths.

In addition, as the rays are densely generated, the traveling paths of the rays assigned to each GPU may be similar to each other.

At step S1120, the simulator can check whether all the generated rays are assigned to the GPUs. If all the rays are assigned, the procedure may return to step S1040 in FIG. 10 and the simulator may analyze the radio wave environment by performing operations for tracking the ray paths on the GPUs.

If all the rays are not assigned, the procedure returns to step S1110 and the unassigned rays may be assigned to the GPUs in sequence. That is, the simulator may sequentially assign rays generated in sequence to the plural GPUs and may perform ray assignment by repeatedly circulating the GPUs until all the rays are assigned to the GPUs.

Consequently, in each GPU, the rays sequentially generated by the transmitter of the simulator may be assigned while being separated by the number of GPUs. The traveling paths of the rays assigned to each of the GPUs may be similar to each other.

For example, it can be assumed that the number of GPUs is 4 and the rays sequentially generated by the transmitter are numbered from 0. It can also be assumed that the simulator assigns ray 0, ray 4, ray 8, etc. to GPU 0, and assigns ray 1, ray 5, ray 9, etc. to GPU 1.

As the simulator densely generates rays with a small spacing therebetween, the rays such as ray 0, ray 4, and ray 8 assigned to GPU 0 may still be dense. As the spacing between rays is small, the traveling paths of ray 0, ray 4, ray 8, etc. may also be similar to each other.

Because the traveling paths of the rays are similar, the simulation performance can be improved by applying ray grouping of the first embodiment to the rays assigned to each GPU.

Figure 12:
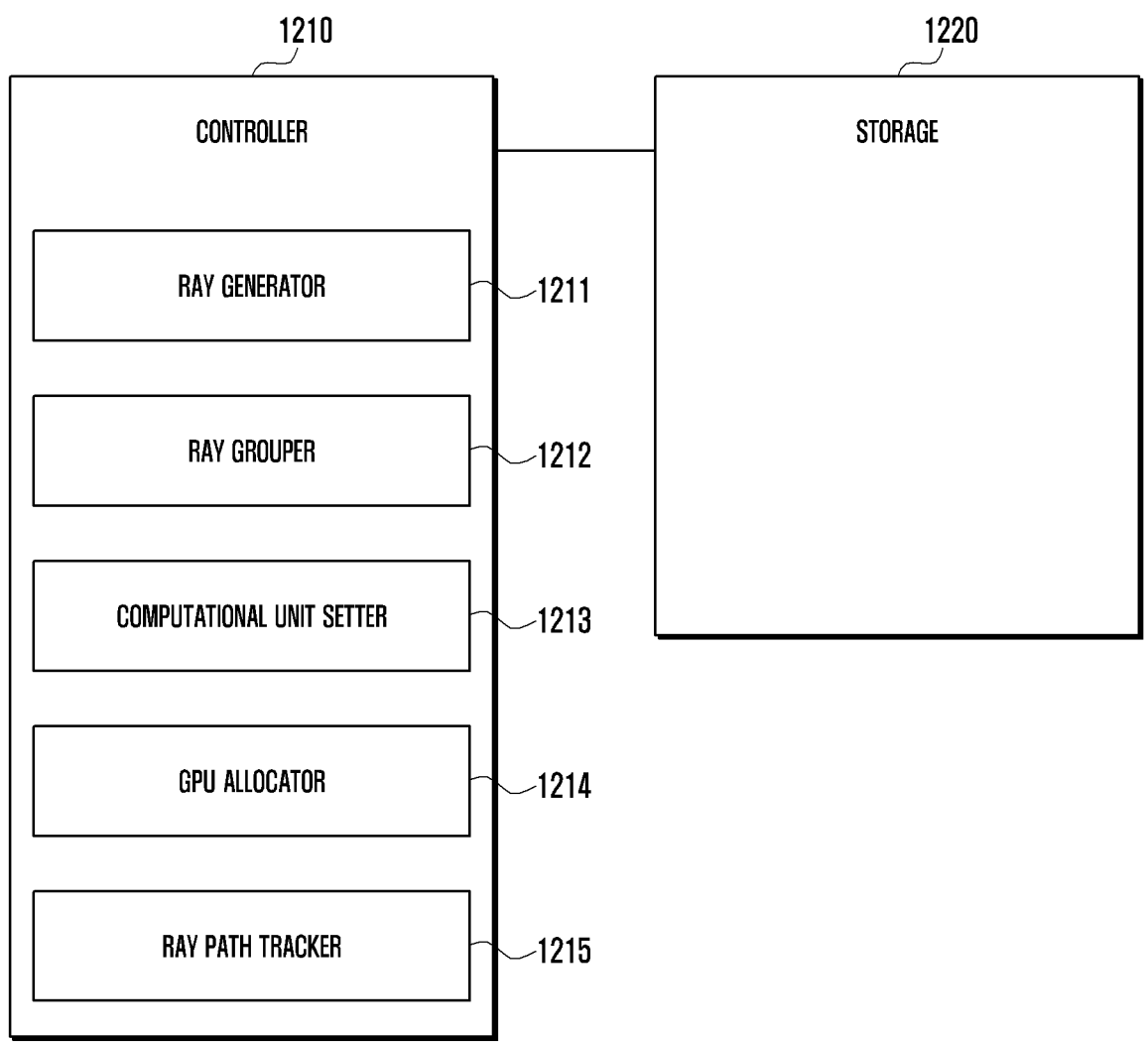
FIG. 12 is a block diagram illustrating an internal structure of the simulator according to an embodiment of the disclosure.

FIG. 12 is a block diagram illustrating the internal structure of a simulator according to the disclosure. As shown in FIG. 12, the simulator of the disclosure may include a controller 1210 and a storage 1220.

The controller 1210 of the simulator may control the overall operation of the simulator. The controller 1210 may generate virtual rays for radio wave environment analysis, and may check whether a ray or a reflection ray thereof is received.

The controller 1210 may group the generated rays based on their traveling paths, and may configure a computational unit so that the same instructions are executed at the same timing when the GPU performs operations to track the traveling paths of the rays in one group. In addition, the controller 1210 may assign the generated rays to plural GPUs based on the workload of each GPU, and may track the paths of a generated ray and a received ray through computations on the GPUs.

To this end, the controller 1210 may include a ray generator 1211 to generate rays in at least one direction, a grouper 1212 to group the generated rays based on the traveling path, a computational unit setter 1213 to configure a computational unit so that the same instructions are executed at the same timing in the ALUs of the GPU when operations are performed to track the traveling paths of rays in one group, a GPU allocator 1214 to assign the generated rays based on the workload of each of the plural GPUs, and a ray path tracker 1215 to track paths of rays to perform a wireless communication network simulation.

Not every element in FIG. 12 may be essential, and one element may be omitted in a certain embodiment.

The ray generator 1211 may determine the angle and direction of rays to be generated by the simulator and generate virtual rays according to the determined direction and angle. The scheme for determining the angle of rays may correspond to step S510 in FIG. 5. Specifically, the ray generator 1211 may form a sphere having a constant radius from the transmitter, serving as the origin, placed at a position indicated by the received position information, and may configure planes parallel to the plane defined by any two axes of the three directional axes forming the sphere at a specific interval between the contact point with the sphere and the opposite contact point. Then, the ray generator 1211 may identify a circle formed by the intersection between the sphere and the plane, and determine the direction of rays to be generated to be a direction from the transmitter toward the circumference of the circle.

As the above angle is narrower, the number of rays to be simulated increases, and the accuracy of the radio wave environment analysis of the simulator can be increased. In addition, as the angle is narrower, the traveling paths of adjacent rays become similar, and the parallel processing of the GPU can be utilized to simultaneously track the paths of multiple rays.

The scheme for determining the direction of rays may correspond to step S520 in FIG. 5 and FIG. 6. The ray generator 1211 may sequentially determine the direction of rays to be generated.

The ray generator 1211 may sequentially generate rays according to the angle and direction determined above. The scheme for the ray generator 1211 to generate rays may correspond to step S530 in FIG. 5 and FIG. 6. The rays sequentially generated by the ray generator 1211 may have traveling paths similar to those of adjacent rays, and may be uniformly distributed on the surface of a sphere having a constant radius.

The grouper 1212 may group the generated rays based on the traveling path. The scheme for the grouper 1212 to group rays may correspond to step S430 in FIG. 4. Specifically, the grouper 1212 may sequentially assign ID numbers from 0 to the generated rays according to the generation order, and may group the rays into groups with a given number of rays.

As the rays are sequentially generated and the spacing between rays is narrow, the traveling paths of the rays in one group with a given number of rays may be similar.

The computational unit setter 1213 may map rays of a group respectively to threads and may configure plural threads as a computational unit of the GPU. The scheme for the computational unit setter 1213 to configure a computational unit may correspond to step S440 in FIG. 4. Rays in a group and adjacent rays may have similar traveling paths, it is possible to minimize the serialization of the GPU execution stream by simultaneously tracking the traveling paths of plural rays. This case may increase the simulation efficiency.

The GPU allocator 1214 may assign the generated rays based on the workload of the plural GPUs. The scheme for the GPU allocator 1214 to assign rays may correspond to step S1030 in FIG. 10 and FIG. 11.

Specifically, the GPU allocator 1214 may sequentially assign rays generated in sequence to the plural GPUs and may perform ray assignment by repeatedly circulating the GPUs until all the rays are assigned to the GPUs. In each GPU, the rays sequentially generated by the ray generator 1211 may be assigned while being separated by the number of GPUs.

As the rays are sequentially assigned to the GPUs, the amounts of workload on the GPUs may be the same or similar. Hence, it is possible to minimize the idle state of the plural GPUs.

In addition, as the rays assigned to each GPU have similar traveling paths, ray grouping can be utilized to maximize the parallel processing of the GPU.

The ray path tracker 1215 may track the paths of rays to perform a wireless communication network simulation. The GPU may be used to perform operations for tracking the paths of plural rays. The scheme for the ray path tracker 1215 to perform a simulation may correspond to step S450 in FIG. 4 and FIG. 8A.

Specifically, the ray path tracker 1215 may check whether a ray intersects an object. If the ray intersects an object, the ray path tracker 1215 may check whether the maximum number of reflections has been reached for the ray. If the maximum number of reflections has not been reached or the ray has not intersected an object, the ray path tracker 1215 may search for a receiver within the reception radius of the ray, and may check whether the ray is received at the receiver and identify the strength of the received ray.

The storage 1220 of the simulator may store information generated in a simulation process.

Specifically, the storage 1220 may store position information of a site whose radio wave environment is to be analyzed and position information indicating possible positions of the transmitter and the receiver. The storage 1220 may store information on virtual rays generated by the transmitter, information on reflection rays generated when the rays intersect objects, and reception check results of rays at the receiver. In addition, the storage 1220 may store the history of a ray (traveling path and direction of the ray) output as a result of the simulation.

As the user can analyze the radio wave environment based on the simulation result, it is possible to identify whether the position of the transmitter having been simulated is appropriate. In addition, the user can perform a plurality of simulations to find the optimal position of the transmitter.

Various embodiments of the disclosure have been shown and described in the specification and drawings for the purpose of illustration without limiting the subject matter of the disclosure. It should be understood by those skilled in the art that many variations and modifications of the basic inventive concept described herein will still fall within the spirit and scope of the disclosure as defined in the appended claims and their equivalents.

The invention claimed is:

1. A method for a simulator in a wireless communication system, the method comprising:
    receiving topographic information and position information indicating possible positions of a transmitter and a receiver in the topographic information;

generating rays for at least one direction of a sphere having a constant radius from the transmitter placed at a position according to the position information;
grouping, based on traveling paths of the rays, the rays into at least one group configured as a set of threads for a graphics processing unit (GPU) of the simulator;
identifying whether a first ray among the rays meets an object;
identifying, in a case of identifying that the first ray has met the object, whether a maximum number of reflections has been reached for the first ray;
identifying in a case of identifying that the maximum number of reflections has been reached a receiver within a reception radius of the first ray;
based on checking whether the first ray is received at the receiver and identifying the strength of the received first ray, performing a wireless communication network simulation for tracking propagation paths; and
analyzing, based on the wireless communication network simulation, a radio wave environment using the GPU on which the set of threads is configured.

2. The method of claim 1, wherein the generating rays comprises:
identifying an angle between rays to be generated;
identifying a direction of rays to be generated; and
generating rays in sequence based on the angle and the direction, and
wherein the identifying the direction of the rays to be generated comprises:
configuring a sphere having a constant radius with the transmitter as an origin;
configuring planes parallel to a plane defined by any two axes of three directional axes defining the sphere at predetermined intervals from a contact point with the sphere to an opposite contact point;
identifying a circle where the sphere meets the plane; and
identifying the direction of rays to be a direction from the transmitter toward a circumference of the circle.

3. The method of claim 1, wherein:
the grouping the generated rays comprises grouping the generated rays into groups with a constant number of adjacent rays;
wherein the configuring the group as the set of threads comprises performing, when operations for tracking a traveling path for at least one ray belonging to the group are performed on the GPU, configuration to execute same instructions at same timing as operations for tracking propagation paths of adjacent rays belonging to the group.

4. The method of claim 3, wherein the performing the wireless network simulation tracking the propagation paths comprises:
tracking propagation paths based on information on rays transmitted by the transmitter and reception check results from at least one receiver.

5. The method of claim 1, further comprising, in a case of determining that the maximum number of reflections has not been reached for the first ray:
generating a reflection ray; and
repeatedly checking whether the reflection ray meets an object until the maximum number of reflections has been reached.

6. A method for a simulator in a wireless communication system, the method comprising:
receiving topographic information and position information indicating possible positions of a transmitter and a receiver in the topographic information;
generating rays for at least one direction of a sphere having a constant radius from the transmitter placed at a position according to the position information;
assigning, based on amounts of workload on a plurality of graphics processing units (GPUs), the rays respectively to the plurality of GPUs in sequence;
repeatedly circulating the plurality of GPUs until all the rays are assigned to the plurality of GPUs; and
analyzing a radio wave environment through operations on the plurality of GPUs.

7. A simulator in a wireless communication system, comprising:
a storage to store topographic information, position information of a transmitter and a receiver in the topographic information, and path tracking results of rays; and
a controller configured to:
generate rays in at least one direction from the transmitter placed at a position according to the position information,
group, based on travelling paths of the rays, the rays into at least one group configured as a set of threads for a graphics processing unit (GPU) of the simulator,
identify whether a first ray among the rays meets an object;
identify, in a case of identifying that the first ray has met the object, whether a maximum number of reflections has been reached for the first ray;
find, in a case of identifying that the maximum number of reflections has been reached, a receiver within a reception radius of the first ray;
based on checking whether the first ray is received at the receiver and identifying the strength of the received first ray, perform a wireless communication network simulation for tracking propagation paths; and
analyze, based on the wireless communication network simulation, a radio wave environment using the GPU on which the set of threads is configured.

8. The simulator of claim 7, wherein the controller is configured to identify an angle and a direction of rays to be generated and generate rays in sequence in the identified angle and direction, and
wherein the controller is further configured to:
configure a sphere having a constant radius with the transmitter as an origin,
configure planes parallel to a plane defined by any two axes of three directional axes forming the sphere at a predetermined intervals from a contact point with the sphere to an opposite contact point,
identify a circle where the sphere meets the plane, and
identify the direction of rays to be a direction from the transmitter toward a circumference of the circle.

9. The simulator of claim 7, wherein the controller is further configured to:
group the generated rays into groups with a constant number of adjacent rays;
perform, when operations for tracking a traveling path for at least one ray belonging to the group are performed on the GPU, configuration to execute same instructions at same timing as operations for tracking propagation paths of adjacent rays belonging to the group; and perform the wireless communication network simulation for tracking propagation paths.

10. The simulator of claim 7, wherein in a case of identifying that the maximum number of reflections has not been reached, the controller is configured to:
generate a reflection ray, and repeatedly check whether the reflection ray meets an object until the maximum number of reflections has been reached.

11. A simulator in a wireless communication system, comprising:
a storage to store topographic information, position information of a transmitter and a receiver in the topographic information, and path tracking results of rays; and
a controller configured to generate rays in at least one direction from the transmitter placed at a position according to the position information, assign the generated rays respectively to a plurality of GPUs based on amounts of workload on the plurality of GPUs, and analyze a radio wave environment through operations on the plurality of GPUs, and
wherein the controller is configured to assign the rays respectively to the plural GPUs in sequence, and repeatedly circulate the plurality of GPUs until all the rays are assigned to the plurality of GPUs.

* * * * *